(12) United States Patent
Wu et al.

(10) Patent No.: US 11,803,118 B2
(45) Date of Patent: Oct. 31, 2023

(54) METHODS AND APPARATUS FOR PHOTOMASK PROCESSING

(71) Applicant: Applied Materials, Inc., Santa Clara, CA (US)

(72) Inventors: Banqiu Wu, San Jose, CA (US); Khalid Makhamreh, Los Gatos, CA (US); Eliyahu Shlomo Dagan, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 108 days.

(21) Appl. No.: 17/228,451

(22) Filed: Apr. 12, 2021

(65) Prior Publication Data
US 2022/0326607 A1    Oct. 13, 2022

(51) Int. Cl.
  *G03F 1/82* (2012.01)
  *H01J 37/32* (2006.01)
  *B08B 7/00* (2006.01)
  *B08B 13/00* (2006.01)

(52) U.S. Cl.
  CPC .............. *G03F 1/82* (2013.01); *B08B 7/0035* (2013.01); *B08B 13/00* (2013.01); *H01J 37/3244* (2013.01); *H01J 37/32082* (2013.01); *H01J 37/3299* (2013.01); *H01J 37/32825* (2013.01); *H01J 37/32972* (2013.01); *H01J 2237/0206* (2013.01); *H01J 2237/335* (2013.01)

(58) Field of Classification Search
  CPC ......... G03F 1/82; B08B 7/0035; B08B 13/00; H01J 37/32082; H01J 37/3244; H01J 37/32825; H01J 37/32972; H01J 37/3299; H01J 2237/0206; H01J 2237/335
  See application file for complete search history.

(56) References Cited

U.S. PATENT DOCUMENTS

| 7,897,968 B2 | 3/2011 | Kuwabara et al. |
| 10,245,623 B2 | 4/2019 | Swanson et al. |
| 2005/0214478 A1 | 9/2005 | Hanawa et al. |

(Continued)

FOREIGN PATENT DOCUMENTS

KR    10-2017-0134812 A    12/2017

OTHER PUBLICATIONS

International Search Report and Written Opinion for PCT PCT/US2022/024191, dated Aug. 1, 2022.

*Primary Examiner* — Erin F Bergner
(74) *Attorney, Agent, or Firm* — MOSER TABOADA

(57) ABSTRACT

Methods and apparatus leverage dielectric barrier discharge (DBD) plasma to treat samples for surface modification prior to photomask application and for photomask cleaning. In some embodiments, a method of treating a surface with AP plasma includes igniting plasma over an ignition plate where the AP plasma is formed by one or more plasma heads of an AP plasma reactor positioned above the ignition plate, monitoring characteristics of the AP plasma with an optical emission spectrometer (OES) sensor to determine if stable AP plasma is obtained and, if so, moving the AP reactor over a central opening of an assistant plate where the central opening contains a sample under treatment and where the assistant plate reduces AP plasma arcing on the sample during treatment. The AP reactor scans back and forth over the central opening of the assistant plate while maintaining stabilized AP plasma to treat the sample.

20 Claims, 5 Drawing Sheets

(56) References Cited

U.S. PATENT DOCUMENTS

| | | |
|---|---|---|
| 2008/0032063 A1 | 2/2008 | Chang et al. |
| 2008/0206915 A1 | 8/2008 | Yamazaki |
| 2009/0229756 A1* | 9/2009 | Nakajima ............ H05H 1/2406 156/345.43 |
| 2010/0218896 A1* | 9/2010 | Ai ......................... C23C 16/509 156/345.43 |
| 2011/0048924 A1 | 3/2011 | Freeborn et al. |
| 2017/0350017 A1 | 12/2017 | Nguyen et al. |

* cited by examiner

METHODS AND APPARATUS FOR PHOTOMASK PROCESSING

FIELD

Embodiments of the present principles generally relate to semiconductor manufacturing.

BACKGROUND

During the fabrication process of semiconductor circuits, photomasks are used in developing photoresist layers that are deposited on a wafer. The wafer surface is typically prepped before the photoresist layer is applied and then the photoresist layer is deposited onto the wafer. A photomask is then used to project a desired circuit layout onto the photoresist layer on the wafer. When the photomask is used to produce very tiny features, any particles or defects on the photomask can cause imperfections in the features in the photoresist layer, reducing yields. To reduce imperfections, the photomasks are often cleaned prior to use in a tool designed for photomask cleaning. Since photomasks need to be cleaned often to maintain optimal performance, the length of time required for cleaning the photomasks can substantially affect the throughput of the manufacturing process.

Accordingly, the inventors have provided methods and apparatus for more efficiently cleaning of photomasks, yielding substantial increases in throughput and photomask performance.

SUMMARY

Methods and apparatus for AP plasma treatment of samples are provided herein.

In some embodiments, an apparatus for treating a surface with atmospheric pressure (AP) plasma may comprise a pedestal with a sample support area that is configured to retain a sample for plasma treatment, an assistant plate surrounding the sample support area with a central opening configured to expose the sample support area to plasma, an ignition plate adjacent to the assistant plate, the ignition plate has a solid upper surface that is configured to interact with plasma during plasma ignition, and a plasma reactor configured to produce AP plasma and positioned above the pedestal, the plasma reactor has one or more plasma heads extending wider than the central opening of the assistant plate, wherein the plasma reactor is positionable over the ignition plate and the assistant plate.

In some embodiments, the apparatus may further include a plurality of gas nozzles configured to flow one or more gases around the one or more plasma heads, wherein the plurality of gas nozzles is configured to flow a mixture of argon gas and oxygen-based gas, wherein the plurality of gas nozzles is configured to flow a mixture of argon gas and hydrogen-based forming gas, an optical emission spectrometer sensor configured to monitor characteristics of the plasma during ignition and surface treatment, wherein the one or more plasma heads is positioned approximately 1 mm to approximately 2 mm above the ignition plate and above uppermost surfaces of the assistant plate, wherein the plasma reactor is configured to scan back and forth over the central opening of the assistant plate during plasma treatment, wherein at least one of a plurality of plasma heads is configured to extend over at least one end of the assistant plate during plasma treatment, wherein the assistant plate is configured to reduce plasma arcing in the sample support area during plasma treatment, wherein the one or more plasma heads has a central RF electrode surrounded by dielectric material with one ground electrode on each side of the central RF electrode, and/or the apparatus is configured to modify a surface of a photomask, to remove a photoresist layer on top of a photomask, or to remove organic defects.

In some embodiments, a method of treating a surface with atmospheric pressure (AP) plasma may comprise igniting AP plasma over an ignition plate, the AP plasma formed by one or more plasma heads of a plasma reactor positioned above the ignition plate, monitoring characteristics of the AP plasma with an optical emission spectrometer (OES) sensor to determine if stable AP plasma is obtained, when the AP plasma is stabilized, moving the plasma reactor over a central opening of an assistant plate, the central opening containing a sample under treatment and wherein the assistant plate reduces AP plasma arcing on the sample during treatment and scanning back and forth over the central opening of the assistant plate while maintaining stabilized AP plasma to treat the sample.

In some embodiments, the method may further comprise monitoring the AP plasma during treatment of the sample to determine an endpoint of the treatment based on an oxygen peak level, scanning back and forth over the central opening of the assistant plate with at least one of a plurality of plasma heads extending over the assistant plate at each end of a single scan to obtain identical AP plasma residence time on a top surface of the sample during treatment, wherein the sample is photomask, wherein the sample under treatment has a top surface to be modified, to have a photoresist layer removed, or to have organic defects removed, flowing a gas mixture of argon gas and oxygen-based gas around an RF electrode of the one or more plasma heads during treatment, flowing water vapor with the gas mixture to produce hydroxyl during the treatment of the sample, and/or flowing a gas mixture of argon gas and hydrogen-based forming gas around an RF electrode of the one or more plasma heads during treatment.

In some embodiments, a non-transitory, computer readable medium having instructions stored thereon that, when executed, cause a method of treating a surface with AP plasma to be performed, the method may comprise igniting AP plasma over an ignition plate, the AP plasma formed by one or more plasma heads of a plasma reactor positioned above the ignition plate, monitoring characteristics of the AP plasma with an optical emission spectrometer (OES) sensor to determine if stable AP plasma is obtained, when the AP plasma is stabilized, moving the plasma reactor over a central opening of an assistant plate, the central opening containing a sample under treatment and wherein the assistant plate reduces AP plasma arcing on the sample during treatment, and scanning back and forth over the central opening of the assistant plate while maintaining stabilized AP plasma to treat the sample.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
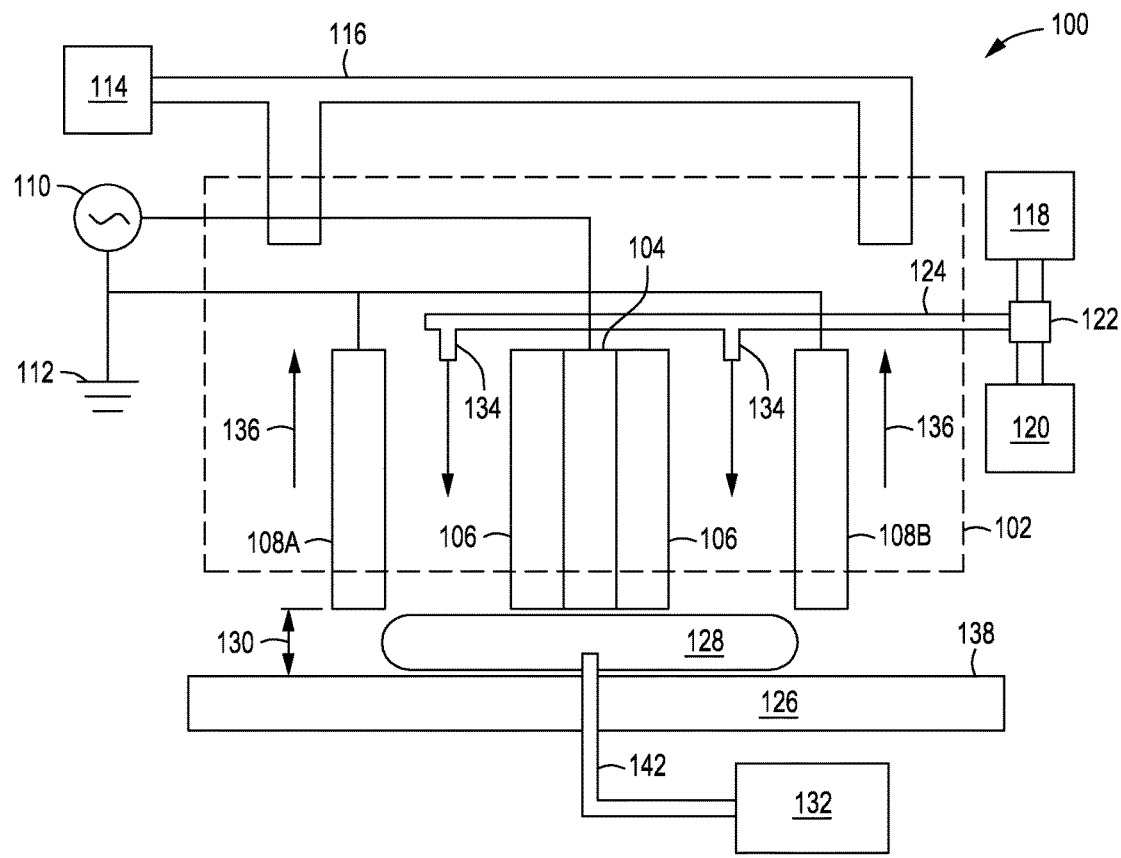
FIG. 1 depicts a cross-sectional view of an AP plasma reactor in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus enable highly efficient photomask processing, dramatically increasing throughput and reducing manufacturing costs. The techniques of the present principles leverage atmospheric pressure (AP) plasma to effectively clean the photomasks. The apparatus has the advantage of a simplified structure (no vacuum is used) with a large plasma area and high throughput to clean organic contamination which may also be used to perform surface modification prior to photomask use. The apparatus also has the flexibility to be used for other semiconductor manufacturing processes as well. In some embodiments, the apparatus may include multiple plasma heads to increase the plasma coverage during a single pass and to ensure equal plasma residence time for all areas of the photomask. In some embodiments, the apparatus utilizes argon gas during processing along with optical emission data for plasma characterization and control, yielding low cost of ownership, high throughput, and stable plasma to reduce damage to the photomask. The use of multiple plasma heads which increases plasma coverage and throughput along with the use of argon instead of helium which decreases operational costs, allows the methods and apparatus to dramatically increase the cost effectiveness of the photomask cleaning processes.

In some embodiments, an AP plasma apparatus provides a dielectric barrier discharge (DBD) plasma cleaner for photomask cleaning. The AP plasma apparatus may be ignited over an ignition plate to avoid having unstable plasma damaging the photomask. The plasma is monitored with optical emission spectrometer (OES) sensors to ensure that the plasma is stable before the plasma heads are moved over the photomask for cleaning or preparation. An assistant plate surrounds the photomask to prevent unwanted arcing or discharges that would damage the photomask during cleaning or preparation. In some embodiments, the OES sensors monitor the processing of the photomask to determine when the photomask treatment has been completed, allowing automatic termination of the process along with improved plasma stability and reduced arcing. The multiple plasma heads of the AP plasma apparatus scan back and forth across the photomask during processing to obtain identical plasma residence time on the photomask. The spacing between the plasma heads allows for overscan to permit complete coverage of the photomask during processing.

DBD is an electrical discharge between two electrodes that are separated by an insulating dielectric barrier. The dielectric barrier produces a self-pulsing plasma operation and establishes a nonthermal plasma at atmospheric pressures. The inventors have found that AP plasma may be used to treat surfaces. Often surfaces are hydrophobic (water resistant) and are treated to modify the surface until the surface is hydrophilic (water absorbing). A hydrophilic surface will increase the bonding strength between the surface and a photoresist layer. The inventors have also found that AP plasma may be used to treat the photomask in order to remove contaminants such as organic contaminants and the like. The inventors have discovered AP plasma methods and apparatus that may be used for both surface modification and photomask cleaning and other tasks. The AP plasma methods and apparatus save both capital expenses (reduces the number of equipment to a single type) and recurring costs as the methods and apparatus are less expensive to operate and have higher throughput.

In FIG. 1, a view 100 of an AP plasma reactor 102 that produces DBD plasma is depicted in accordance with some embodiments. The AP plasma reactor 102 has an RF electrode 104 that is surrounded by a dielectric layer 106 and powered by an RF power supply 110 that also interfaces with a ground 112. The RF electrode 104 generates plasma 128 to treat a sample 126. The sample 126 may be a photomask to be cleaned or a surface to be modified and the like. The plasma 128 is generated between the RF electrode 104 and a first ground electrode 108A and a second ground electrode 108B. The first ground electrode 108A and the second ground electrode 108B are electrically connected to the ground 112. The RF electrode 104 (with dielectric layer 106), the first ground electrode 108A, and the second ground electrode 108B form an AP plasma head. In some embodiments, RF power may be supplied to the AP plasma head at approximately 100 watts to approximately 700 watts of total power during sample processing. In some embodiments, RF power may be supplied to the AP plasma at approximately 500 watts to approximately 700 watts of total power during sample processing. In some embodiments, the RF power may be supplied at a frequency of approximately 13.56 MHz and the like. During processing of the sample 126, a gas mixture is flowed around the outside of the dielectric layer 106 between the dielectric layer 106 and the first ground electrode 108A and the second ground electrode 108B towards the sample 126. In some embodiments, the gas mixture may be generated from a first gas supply 118 and a second gas supply 120 that is intermixed by a mixing apparatus 122 and flowed through a gas line 124 and out a plurality of nozzles 134.

In some embodiments, the first gas supply 118 supplies a carrier gas such as argon gas and the like and the second gas supply 120 supplies a reactive gas such as oxygen gas and the like. In some embodiments, water vapor may also be combined with the gas mixture by the mixing apparatus 122 during processing of the sample 126. The oxygen gas is disassociated within the plasma 128 to form atomic oxygen. In some embodiments, the reactive gas may be flowed at a rate of approximately 30 sccm to approximately 60 sccm. In some embodiments, the flow rate of the reactive gas may be approximately 40 sccm. In some embodiments, the carrier gas may be flowed at a rate of approximately 10 liters per minute to approximately 60 liters per minute. In some embodiments, the carrier gas may be flowed at a rate of approximately 50 liters per minute. When water vapor is added to the mixture, the water vapor will form hydroxyl (OH) radicals in the plasma. A reactive gas such as oxygen gas produces atomic oxygen in the plasma and, when stripping a photoresist layer on a photomask, may produce too much atomic oxygen which depletes the hydrogen in the photoresist layer of the photomask too fast producing a carbon rich organic layer when doing a photoresist strip on the photomask. By controlling the oxygen gas peak and the hydroxyl peak (from the water vapor), the rate of hydrogen depletion can be controlled during photomask processing. The reactive gas may be a forming gas consisting of an inert gas such as argon and/or hydrogen. Hydrogen concentration is between 1% to 5% for safety reasons. The reason to use a forming gas as a reactive gas is to remove the photoresist or other organic in a reducing environment in order to oxidize the layers on the photomask.

A ventilation apparatus 114 uses a ducting system 116 to remove byproducts from the processing of the sample 126. In some embodiments, the ventilation apparatus 114 may include a blower apparatus and the like. The ventilation flow 136 is to the outer side of the first ground electrode 108A and to the outer side of the second ground electrode 108B. The plasma 128 may be monitored by an optical emissions spectrometer (OES) sensor 132 via a fiber optic input 142 to determine the characteristics of the plasma 128 during ignition and also during processing of the sample 126. The OES sensor 132 is able to monitor the peaks of different wavelengths which relate to different gases to determine characteristics of the plasma. The plasma characteristics are used to adjust the plasma during ignition and also during processing to determine plasma stability, improve the plasma, and to determine processing endpoints. For example, oxygen levels in the plasm will increase as a photomask reaches completion of the process because less oxygen is needed. When the oxygen level peaks become consistent, the endpoint of the process can be determined and the processing automatically halted. The spacing 130 between the lowermost portion of the RF electrode 104, the first ground electrode 108A, and the second ground electrode 108B to the uppermost surface 138 of the sample 126 is approximately 1 millimeter to approximately 2 millimeters.

Figure 2:
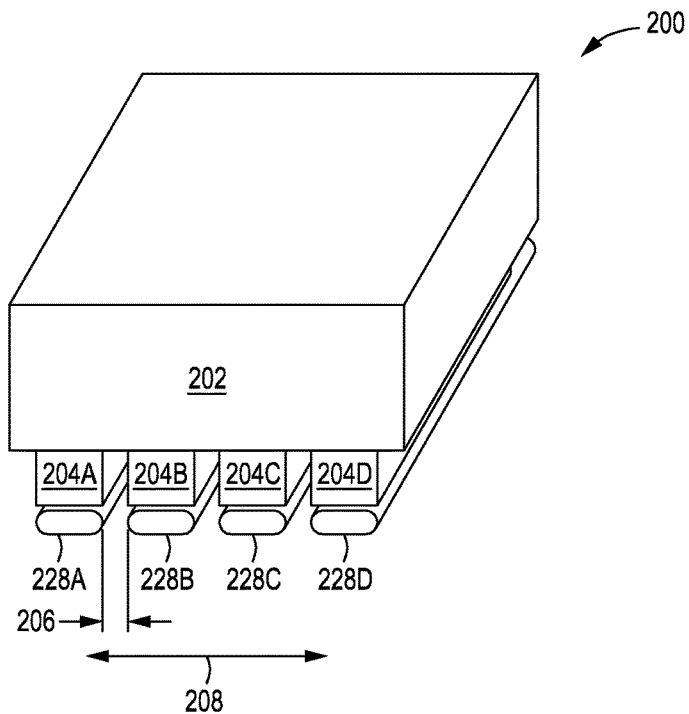
FIG. 2 depicts an isometric view of an AP plasma reactor in accordance with some embodiments of the present principles.

FIG. 2 depicts a view 200 of an AP plasma reactor 202 that produces DBD plasma in accordance with some embodiments. The AP plasma reactor 202 incorporates a plurality of AP plasma heads 204A-204D that produce a plurality of plasma areas 228A-228D to increase the overall plasma coverage area, increasing the throughput. The AP plasma reactor 202 may have any number of AP plasma heads. Spacing 206 between the plurality of AP plasma heads 204A-204D allow for ventilation of byproducts that are produced during processing of a sample. As the sample and/or the AP plasma reactor 202 may move back and forth relative to each other in a scanning fashion, the spacing 206 between the plurality of plasma areas 228A-228D is compensated for by the movement 208.

Figure 3:
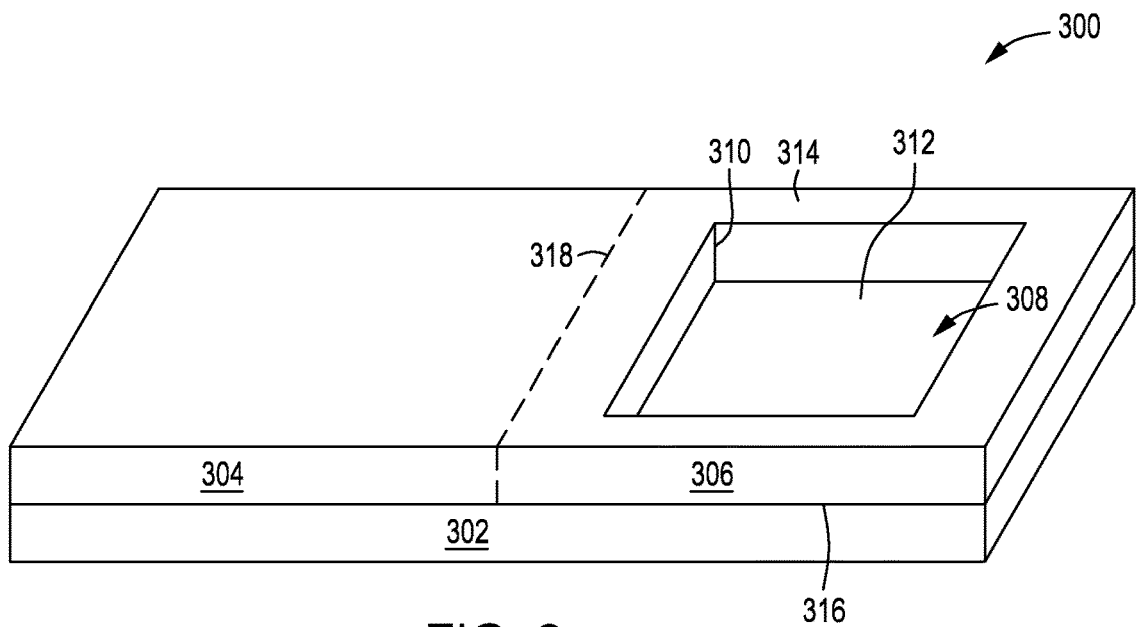
FIG. 3 depicts an isometric view of an ignition plate and an assistant plate in accordance with some embodiments of the present principles.

In FIG. 3, a view 300 of an ignition plate 304 and an assistant plate 306 in accordance with some embodiments. In some embodiments, the ignition plate 304 and the assistant plate 306 may be supported by a pedestal apparatus 302 that may be stationary and/or movable in relation to an AP plasma reactor 412 (see FIG. 4). In some embodiments where the pedestal apparatus 302 is stationary, the AP plasma reactor 412 is movable and vice versa. In some embodiments, the ignition plate 304 and the assistant plate 306 may be formed together as a unitary structure. In other embodiments, the ignition plate 304 and the assistant plate 306 may formed separately and placed adjacent to each other with or without an intervening space or gap (not shown). An interface between the ignition plate 304 and the assistant plate 306 is denoted by dashed line 318. The ignition plate 304 and the assistant plate 306 may be formed from a photomask-like material such as a fused silica material and the like with metallic coatings. In some embodiments, the metallic coatings of the ignition plate 304 and/or the assistant plate 306 may or may not be coupled to an electrical ground.

The ignition plate 304 provides an area for igniting the plasma produced by the AP plasma reactor 412 without causing damage to a sample. When AP plasma is generated, arcing may occur. The ignition plate 304 is used to prevent arcing damage to a sample being processed during plasma ignition and the assistant plate 306 is used to prevent arcing damage to the sample during processing. The assistant plate 306 has a central opening 308 that accepts a sample. The central opening 308 may be any shape such as a circle, rectangle, or other shape that will accommodate a sample. In some embodiments, the central opening 308 has a bottom 312 that is recessed below a top surface 314 of the assistant plate 306. In some embodiments, the dimensions (width and length) of the central opening 308 may be approximately 6 inches in width by 6 inches in length for photomask samples. In some embodiments, the recess depth 310 may be approximately 0.05 inches to approximately 0.375 inches to accommodate a thickness of a photomask. In some embodiments, the recess depth 310 may be approximately 0.25 inches to accommodate the thickness of the photomask. The recess depth 310 forms a step that accommodates a thickness of a sample such that an upper surface of a sample is co-planar or below with the top surface of the assistant plate 306. If plasma arcing occurs, the arcing will be across the ends of the plasma heads that are over the edges of the assistant plate 306 rather than on the sample being processed. In some embodiments, the bottom 312 of the central opening 308 may be formed by a top surface 316 of the pedestal apparatus 302.

Figure 4:
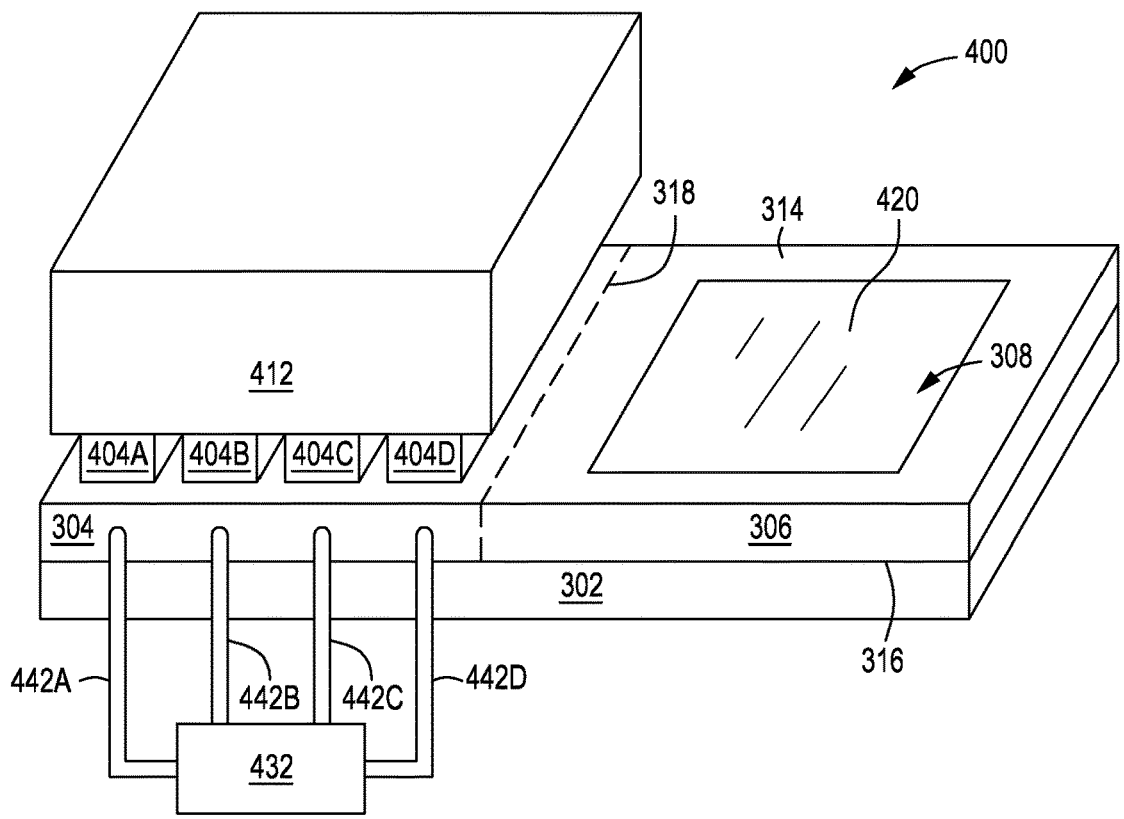
FIG. 4 depicts an isometric view of a plasma reactor on an ignition plate in accordance with some embodiments of the present principles.

In FIG. 4, a view 400 of an AP plasma reactor 412 on the ignition plate 304 in accordance with some embodiments. The AP plasma reactor 412 is moved over the ignition plate 304 during plasma ignition. If the AP plasma reactor 412 was placed over a sample 420 during plasma ignition (when the plasma is unstable), the sample 420 would likely sustain damage due to arcing of the plasma during ignition. In the example of FIG. 4, the AP plasma reactor 412 has four AP plasma heads 404A-404D that each produce a respective plasma. The number of AP plasma heads may be from one to any number and is selected to ensure high coverage of the sample during processing and to increase throughput. The throughput is increased by having a high coverage percentage of the sample by the plasma and also by the manner in which the AP plasma heads are arranged over the sample (to give identical residence time for all areas of the sample with each pass). An OES sensor 432 has a plurality of fiber optic inputs 442A-442D to monitor the respective plasma of the four AP plasma heads 404A-404D. The OES sensor 432 receives wavelength information from the respective plasmas to determine if the plasmas are stable. When the plasma is stable, the detected wavelength peaks will not fluctuate over time. In some embodiments, when the respective plasmas have stabilized, the AP plasma reactor automatically begins processing of the sample 420. The OES sensor 432 may move with the AP plasma reactor 412 to characterize the respective plasmas during ignition and also during processing of the sample 420.

Figure 5:
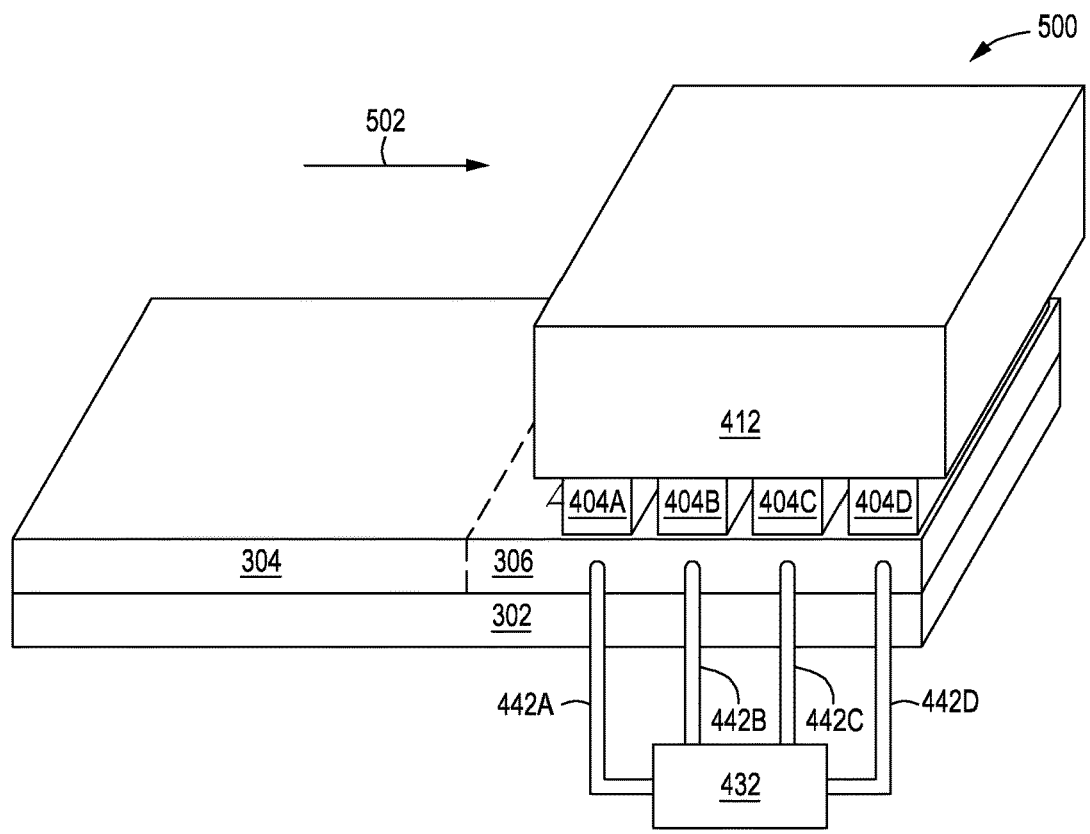
FIG. 5 depicts an isometric view of an AP plasma reactor on a photomask and an assistant plate in accordance with some embodiments of the present principles.
Figure 6:
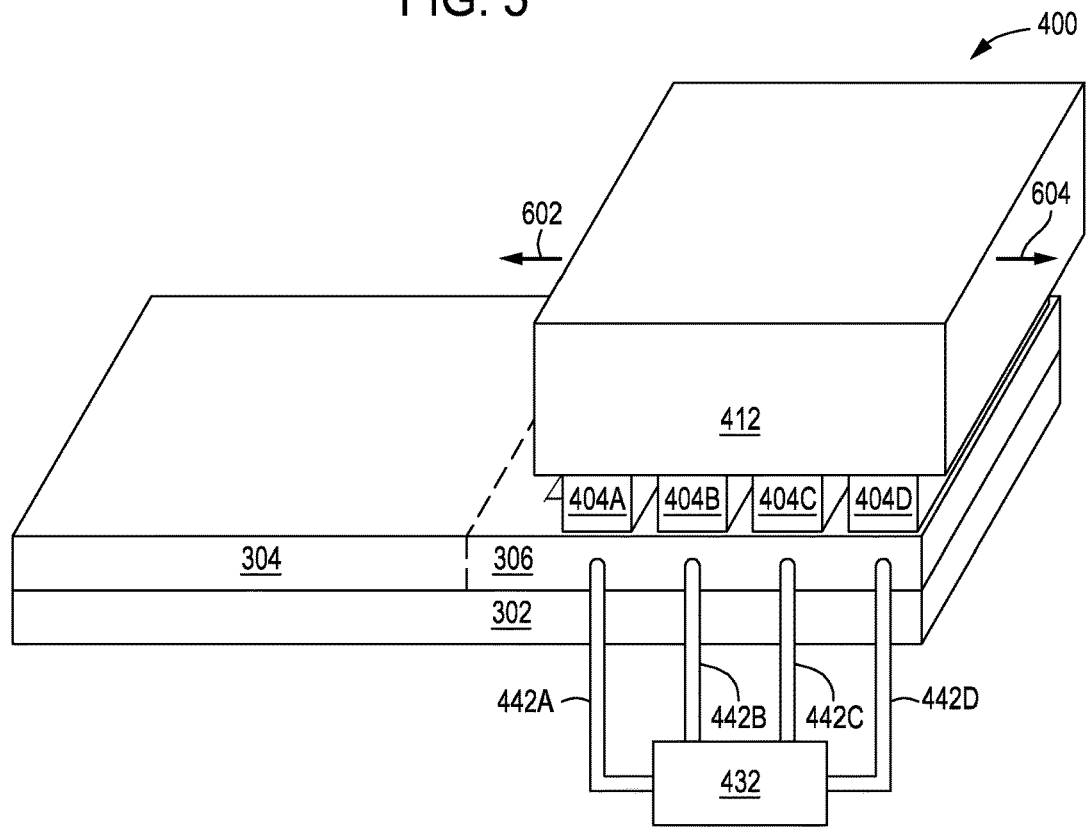
FIG. 6 depicts an isometric view of an AP plasma reactor scanning a sample in accordance with some embodiments of the present principles.

FIG. 5 depicts a view 500 of the AP plasma reactor 412 on the assistant plate 306 in accordance with some embodiments. When the respective plasmas of the AP plasma reactor 412 have stabilized, the AP plasma reactor 412 is moved 502 over the sample 420 (under the AP plasma reactor 412 in FIG. 5). The plurality of AP plasma heads 404A-404D are wider than the central opening 308 in the assistant plate 306 to reduce arcing of the plasma and protect the sample 420 during processing. In FIG. 6, a view 600 of the AP plasma reactor 412 is depicted scanning the sample 420 in accordance with some embodiments. The AP plasma reactor 412 moves back 602 and forth 604 over the sample 420 to provide identical residence time of the plasmas on the sample 420 during processing. In some embodiments, the rate of scanning over the sample may be from approximately 5 mm per second to approximately 20 mm per second. In some embodiments, the AP plasma reactor 412 may scan back and forth approximately 50 times to approximately 100 times during processing of the sample 420. The OES sensor 432 may move in conjunction with the AP plasma reactor 412 to ensure that the plasma maintains optimal characteristics. In some embodiments, the OES sensor 432 may be used during the processing of the sample 420 to determine a processing endpoint. The OES sensor 432 is able to detect oxygen and argon peak levels within the plasma. During processing of photomask samples, when the oxygen peak levels remain constant, the photomask sample processing is complete and the scanning can be automatically stopped.

Figure 7:
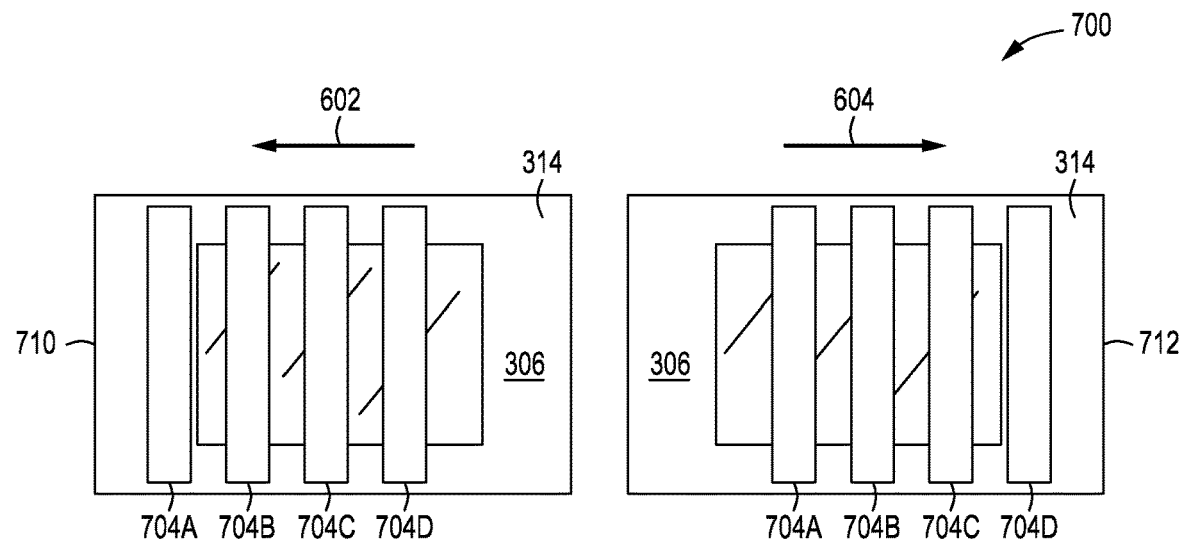
FIG. 7 depicts a top-down view of plasma areas on an assistant plate during scanning in accordance with some embodiments of the present principles.

In FIG. 7, a top down view 700 of plasma areas 704A-D on the sample 420 and the assistant plate 306 during scanning are depicted in accordance with some embodiments. The plasma areas 704A-D may be generated by the respective AP plasma heads 404A-D of the AP plasma reactor 412. To provide identical residence time of the plasma on the sample 420, the plasma areas 704A-D may overlap the top surface 314 of the assistant plate 306 at a first end 710 of the assistant plate 306 as the AP plasma reactor moves back 602 (plasma area 704A is over the top surface 314 of the assistant plate 306 at the first end 710) and may overlap the top surface 314 of the assistant plate 306 at a second end 712 of the assistant plate 306 as the AP plasma reactor moves forth 604 (plasma area 704D is over the top surface 314 of the assistant plate 306 at the second end 712).

Figure 8:
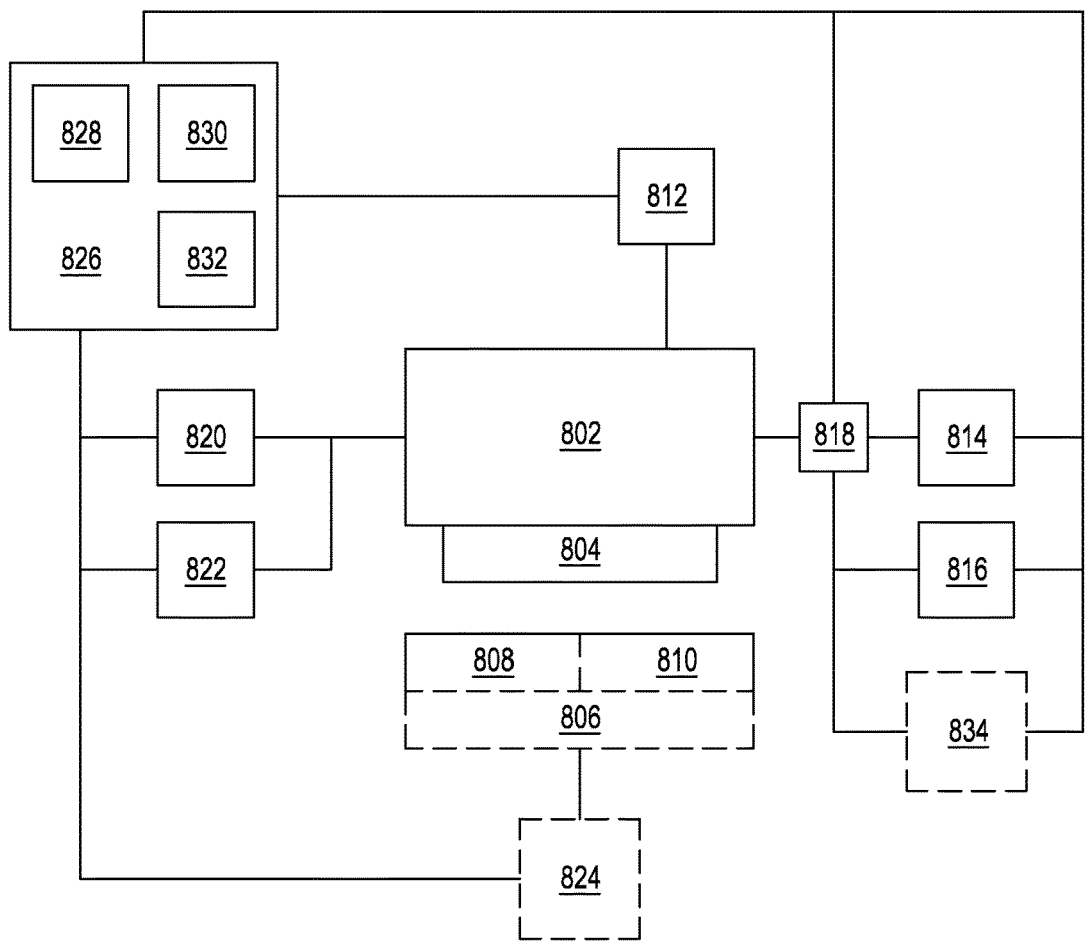
FIG. 8 depicts a cross-sectional view of an AP plasma processing system in accordance with some embodiments of the present principles.

FIG. 8 depicts a view of an AP plasma processing system 800 that produces DBD plasma in accordance with some embodiments. The AP plasma processing system 800 includes an AP plasma reactor 802 with one or more AP plasma heads 804. The AP plasma reactor 802 is positioned above an ignition plate 808 and an assistant plate 810 that reside on an optional support pedestal 806. In some embodiments, the AP plasma reactor 802 moves in relation to the ignition plate 808 and the assistant plate 810. In some embodiments, the ignition plate 808 and the assistant plate 810 move in relation to the AP plasma reactor 802. An optional actuator 824 may be used to move the ignition plate 808 and the assistant plate 810 to perform ignition of the plasma over the ignition plate 808 and to scan a sample in the assistant plate 810. The optional actuator 824 may be controlled by and provide feedback to a controller 826. The AP plasma reactor 802 may interface with an RF power supply 820 to facilitate in generating plasma beneath the one or more AP plasma heads 804. The RF power supply 820 and the ground electrodes (not shown) of the one or more AP plasma heads 804 may also be electrically connected to a system ground (not shown).

A first gas supply 814 and a second gas supply 816 may be mixed in gas mixer 818 and flowed over the RF electrodes in the one or more AP plasma heads 804. In some embodiments, an optional water vapor supply 834 may also be mixed with the mixed gases and flowed over the RF electrodes in the one or more AP plasma heads 804. A venting apparatus 822 may also be used in the AP plasma processing system 800 to remove byproducts that occur during processing of a sample. An OES sensor 812 may also provide plasma characterization for the AP plasma processing system 800 during ignition of the plasma and during processing of the sample. The controller 826 interacts with one or more of the apparatus of the AP plasma processing system 800 to automate and/or regulate processes and timing to ensure optimal performance of the AP plasma processing system 800. The controller 826 may alter power levels of the RF power supply 820, venting velocities of the venting apparatus 822, gas mixture levels of the first gas supply and the second gas supply, water vapor supply levels, and movement of the AP plasma reactor 802 and/or the ignition plate 808/assistant plate 180 based on processing recipes and/or feedback from the OES sensor 812 and the like.

The controller 826 controls the operation of the AP plasma processing system 800 using direct control or alternatively, by controlling the computers (or controllers) associated with an apparatus of the AP plasma processing system 800. In operation, the controller 826 enables data collection and feedback from the respective apparatus and systems to optimize performance of the AP plasma processing system 800. The controller 826 generally includes a Central Processing Unit (CPU) 828, a memory 830, and a support circuit 832. The CPU 828 may be any form of a general-purpose computer processor that can be used in an industrial setting. The support circuit 832 is conventionally coupled to the CPU 828 and may comprise a cache, clock circuits, input/output subsystems, power supplies, and the like. Software routines, such as a method as described below may be stored in the memory 830 and, when executed by the CPU 828, transform the CPU 828 into a specific purpose computer (controller 826). The software routines may also be stored and/or executed by a second controller (not shown) that is located remotely from the AP plasma processing system 800.

The memory 830 is in the form of computer-readable storage media that contains instructions, when executed by the CPU 828, to facilitate the operation of the semiconductor processes and equipment. The instructions in the memory 830 are in the form of a program product such as a program that implements the methods of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Figure 9:
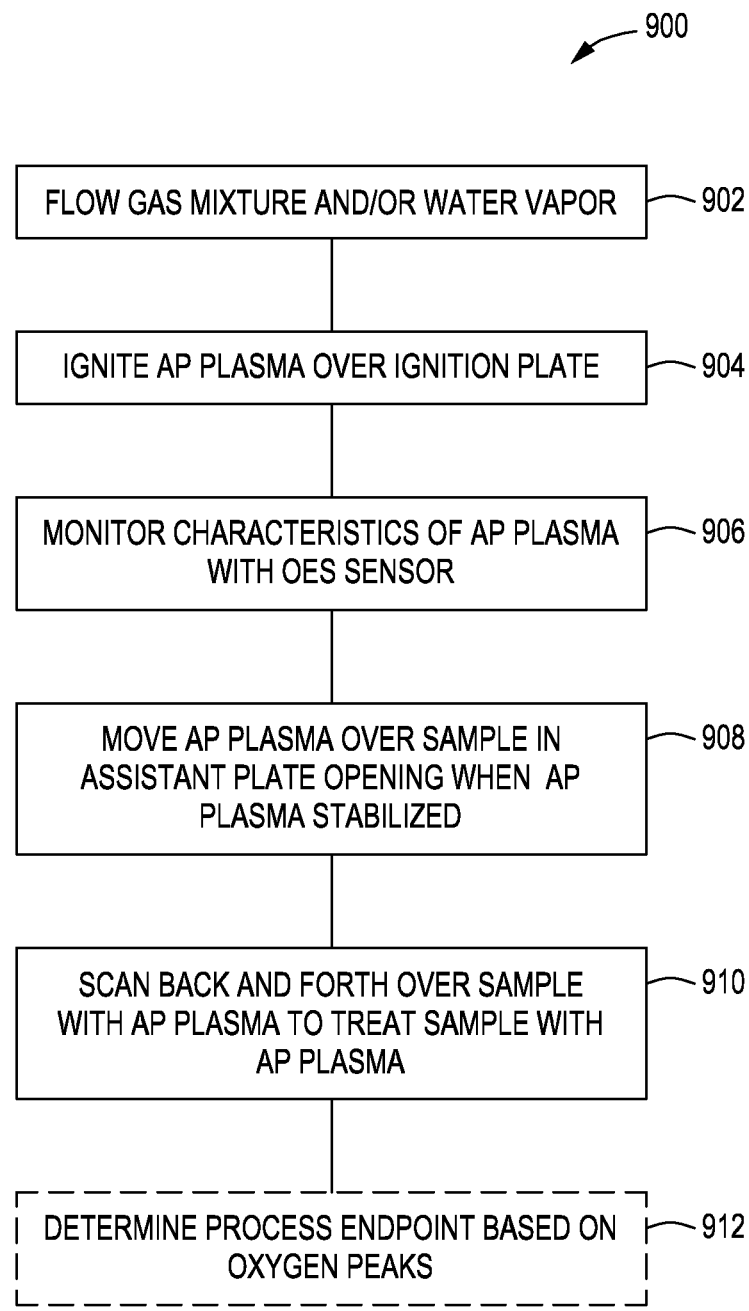
FIG. 9 is a method of processing a sample with AP plasma in accordance with some embodiments of the present principles.

FIG. 9 depicts a method 900 of processing a sample with AP plasma in accordance with some embodiments. In block 902, a gas mixture and/or water vapor is flowed into the AP plasma during processing. The gas mixture contains a carrier gas and a reactive gas as described above. The carrier gas may be, for example but not limited to, argon gas and the like. Argon gas has the advantage of being more cost effective than using a carrier gas such as helium. The reactive gas may be oxygen gas that produces atomic oxygen in the plasma. In some embodiments, water vapor may be used as well to create hydroxyl radicals in the plasma to better control the hydrogen depletion rate of the sample as discussed above. In block 904, AP plasma is ignited over an ignition plate. When the plasma is ignited over the ignition plate instead of over a sample, any arcing that occurs during the ignition does not damage the sample. In block 906, characteristics of the AP plasma are monitored by an OES sensor. The OES sensor monitors the ignition process to determine the characteristics of the plasma and to determine when the plasma is stable before the plasma is moved over the sample for processing. When the plasma is stable, detected parameters of the plasma will not be fluctuating over time. In block 908, the AP plasma is moved over a sample in an assistant plate opening after the AP plasma has been stabilized. In some embodiments, moving from the ignition plate to the assistant plate may be automated based on the stability of the plasma detected by the OES sensor. The edges of the assistant plate provide a path for any AP plasma arcing that may occur during processing to eliminate/reduce damage to the sample.

In block 910, the sample is treated by scanning the AP plasma back and forth over the sample with AP plasma. The scanning is accomplished such that the AP plasma overlaps on both ends of the assistant plate to ensure that identical AP plasma residence time occurs over areas of the sample. The OES sensors may also be utilized to monitor the AP plasma characteristics during processing to ensure that the AP plasma remains stable and also to monitor the oxygen levels and the like. In some embodiments, the AP plasma is used to modify a surface prior to application of a photomask. In some embodiments, the AP plasma is used to clean a surface of a photomask. In optional block 912, an endpoint of the sample treatment may be determined based on oxygen peak levels. Oxygen may be utilized during the treatment of the sample and when the treatment has completed, the oxygen levels in the plasma will rise. As the oxygen peak levels become consistent, a determination can be made that the treatment is complete. In some embodiments, the plasma may be automatically removed after an endpoint is detected by the OES sensor and the next sample automatically processed.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. An apparatus for treating a surface with atmospheric pressure (AP) plasma, comprising: a pedestal with a sample support area that is configured to retain a sample for plasma treatment; an assistant plate surrounding the sample support area with a central opening configured to contain the sample; an ignition plate adjacent to the assistant plate, the ignition plate has a solid upper surface that is configured to interact with the AP plasma during plasma ignition; a plasma reactor configured to produce the AP plasma and positioned above the pedestal, the plasma reactor has one or more plasma heads extending wider than the central opening of the assistant plate, wherein the plasma reactor is positionable over the ignition plate and the assistant plate; an optical emission spectrometer (OES) sensor configured to monitor characteristics of the AP plasma during ignition and surface treatment; and a controller configured to perform a method of treating the surface with the AP plasma that comprises: igniting the AP plasma over the ignition plate, the AP plasma formed by the one or more plasma heads of the plasma reactor positioned above the ignition plate; monitoring the characteristics of the AP plasma with the OES sensor to determine if stable AP plasma is obtained; when the AP plasma is stabilized, moving the plasma reactor over the central opening of the assistant plate, the central opening containing the sample; and scanning back and forth over the central opening of the assistant plate while maintaining stabilized AP plasma to treat the sample.

2. The apparatus of claim 1, further comprising:
a plurality of gas nozzles configured to flow one or more gases around the one or more plasma heads.

3. The apparatus of claim 2, wherein the plurality of gas nozzles is configured to flow a mixture of argon gas and oxygen-based gas.

4. The apparatus of claim 2, wherein the plurality of gas nozzles is configured to flow a mixture of argon gas and hydrogen-based forming gas.

5. The apparatus of claim 1, the method further comprises:
monitoring the AP plasma during treatment of the sample to determine an endpoint of the treatment based on an oxygen peak level.

6. The apparatus of claim 1, wherein the one or more plasma heads is positioned approximately 1 mm to approximately 2 mm above the ignition plate and above uppermost surfaces of the assistant plate.

7. The apparatus of claim 1, wherein the plasma reactor is configured to scan back and forth over the central opening of the assistant plate during plasma treatment.

8. The apparatus of claim 1, wherein at least one of a plurality of plasma heads is configured to extend over at least one end of the assistant plate during plasma treatment.

9. The apparatus of claim 1, the method further comprises scanning back and forth over the central opening of the assistant plate with at least one of a plurality of plasma heads extending over the assistant plate at each end of a single scan to obtain identical AP plasma residence time on a top surface of the sample during treatment.

10. The apparatus of claim 1, wherein the one or more plasma heads has a central RF electrode surrounded by dielectric material with one ground electrode on each side of the central RF electrode.

11. The apparatus of claim 1, wherein the sample is a photomask, and the apparatus is configured to modify a surface of the photomask, to remove a photoresist layer on top of the photomask, or to remove organic defects.

12. A method of treating a surface with atmospheric pressure (AP) plasma, comprising:
   igniting the AP plasma over an ignition plate, the AP plasma formed by one or more plasma heads of a plasma reactor positioned above the ignition plate;
   monitoring characteristics of the AP plasma with an optical emission spectrometer (OES) sensor to determine if stable AP plasma is obtained;
   when the AP plasma is stabilized, moving the plasma reactor over a central opening of an assistant plate, the central opening containing a sample and wherein the one or more plasma heads of the plasma reactor are wider than the central opening in the assistant plate; and
   scanning back and forth over the central opening of the assistant plate while maintaining stabilized AP plasma to treat the sample.

13. The method of claim 12, further comprising:
   monitoring the AP plasma during treatment of the sample to determine an endpoint of the treatment based on an oxygen peak level.

14. The method of claim 12, further comprising:
   scanning back and forth over the central opening of the assistant plate with at least one of a plurality of plasma heads extending over the assistant plate at each end of a single scan to obtain identical AP plasma residence time on a top surface of the sample during treatment.

15. The method of claim 12, wherein the sample is a photomask.

16. The method of claim 12, wherein the sample has a top surface to be modified, to have a photoresist layer removed, or to have organic defects removed.

17. The method of claim 12, further comprising:
   flowing a gas mixture of argon gas and oxygen-based gas around an RF electrode of one or more plasma heads during treatment.

18. The method of claim 17, further comprising:
   flowing water vapor with the gas mixture to produce hydroxyl during treatment of the sample.

19. The method of claim 12, further comprising:
   flowing a gas mixture of argon gas and hydrogen-based forming gas around an RF electrode of one or more plasma heads during treatment.

20. A non-transitory, computer readable medium having instructions stored thereon that, when executed, cause a method of treating a surface with atmospheric pressure (AP) plasma to be performed, the method comprising:
   igniting the AP plasma over an ignition plate, the AP plasma formed by one or more plasma heads of a plasma reactor positioned above the ignition plate;
   monitoring characteristics of the AP plasma with an optical emission spectrometer (OES) sensor to determine if stable AP plasma is obtained;
   when the AP plasma is stabilized, moving the plasma reactor over a central opening of an assistant plate, the central opening containing a sample and wherein the one or more plasma heads of the plasma reactor are wider than the central opening in the assistant plate; and
   scanning back and forth over the central opening of the assistant plate while maintaining stabilized AP plasma to treat the sample.

\* \* \* \* \*